(12) United States Patent
Elgaard (10) Patent No.: US 9,692,354 B2
(45) Date of Patent: Jun. 27, 2017

(54) OSCILLATOR CIRCUIT WITH TWO SWITCHABLE OSCILLATORS

(71) Applicant: TELEFONAKTIEBOLAGET LM ERICSSON (PUBL), Stockholm (SE)

(72) Inventor: Christian Elgaard, Lund (SE)

(73) Assignee: TELEFONAKTIEBOLAGET LM ERICSSON (PUBL), Stockholm (SE)

( * ) Notice: Subject to any disclaimer, the term of this patent is extended or adjusted under 35 U.S.C. 154(b) by 0 days.

(21) Appl. No.: 15/101,646

(22) PCT Filed: Dec. 10, 2014

(86) PCT No.: PCT/EP2014/077187
§ 371 (c)(1),
(2) Date: Jun. 3, 2016

(87) PCT Pub. No.: WO2015/091141
PCT Pub. Date: Jun. 25, 2015

(65) Prior Publication Data
US 2016/0308491 A1    Oct. 20, 2016

(30) Foreign Application Priority Data

Dec. 16, 2013 (EP) .................................... 13197536

(51) Int. Cl.
*H03B 5/32* (2006.01)
*H03B 5/06* (2006.01)
(Continued)

(52) U.S. Cl.
CPC ............. *H03B 5/06* (2013.01); *H03B 5/32* (2013.01); *H03K 21/38* (2013.01); *H03L 3/00* (2013.01); *H03L 7/099* (2013.01); *H04W 88/02* (2013.01)

(58) Field of Classification Search
CPC . H03B 5/32; H03B 5/06; H03K 3/354; H03K 21/38; H03L 7/099
(Continued)

(56) References Cited

U.S. PATENT DOCUMENTS 5,982,246 A    11/1999 Hofhine et al.
7,439,820 B2   10/2008 Gehring
(Continued)

FOREIGN PATENT DOCUMENTS

JP    2001-251140 A    9/2001
JP    2009-188738 A    8/2009
(Continued)

OTHER PUBLICATIONS

International Search Report and Written Opinion in related International Application No. PCT/EP2014/077187 mailed Feb. 10, 2015.

*Primary Examiner* — Arnold Kinkead
(74) *Attorney, Agent, or Firm* — Patent Portfolio Builders PLLC (57) ABSTRACT

An oscillator circuit comprises a first, high-Q crystal oscillator and a second, low-Q oscillator arranged for kick-starting the crystal oscillator at switch-on by coupling the second oscillator to the first oscillator for a time period. The oscillator circuit is arranged to select the frequency of the second oscillator by placing the second oscillator in a phase locked loop with the first oscillator providing a reference frequency, and adjusting the frequency of the second oscillator towards the frequency of the first oscillator.

13 Claims, 7 Drawing Sheets

(51) Int. Cl.
*H03L 3/00* (2006.01)
*H03L 7/099* (2006.01)
*H03K 21/38* (2006.01)
*H04W 88/02* (2009.01)

(58) Field of Classification Search
USPC ...... 331/158, 117 FE, 117 R, 116 FE, 116 R, 331/2, 167, 46
See application file for complete search history.

(56) References Cited

U.S. PATENT DOCUMENTS

| | | |
|---|---|---|
| 7,482,888 B1 | 1/2009 | Kleveland |
| 7,554,414 B2 | 6/2009 | Christ |
| 8,413,523 B2 | 4/2013 | Bessho |
| 2005/0083139 A1 | 4/2005 | Gazit |
| 2009/0015342 A1 | 1/2009 | Kleveland |
| 2009/0066434 A1 | 3/2009 | Isberg |

FOREIGN PATENT DOCUMENTS

| | | |
|---|---|---|
| WO | 94/27372 | 11/1994 |
| WO | 2004/036733 A2 | 4/2004 |

| $F_1$ (MHz) | ΔF (% of $F_1$) | ΔF (MHz) | Target T1 (ns) | Target Count | Maximum T1 (ns) | Minimum T1 (ns) | Energy Transferred (% of maximum) |
|---|---|---|---|---|---|---|---|
| 26 | 1.9 | 0.5 | 1000 | 26 | 1020 | 981 | 99.9526 |
| 26 | 3.8 | 1.0 | 500 | 13 | 520 | 481 | 99.8027 |
| 26 | 7.7 | 2.0 | 250 | 6.5 (7) | 271 | 232 | 99.1445 |
| 26 | 11.5 | 3.0 | 167 | 4.33 (5) | 188 | 149 | 97.9084 |
| 26 | 15.4 | 4.0 | 125 | 3.25 (4) | 148 | 108 | 95.9493 |

OSCILLATOR CIRCUIT WITH TWO SWITCHABLE OSCILLATORS

FIELD OF THE DISCLOSURE

The present disclosure relates to an oscillator circuit, a method of operating an oscillator circuit, and a wireless communication device comprising an oscillator circuit.

BACKGROUND TO THE DISCLOSURE

Figure 1:
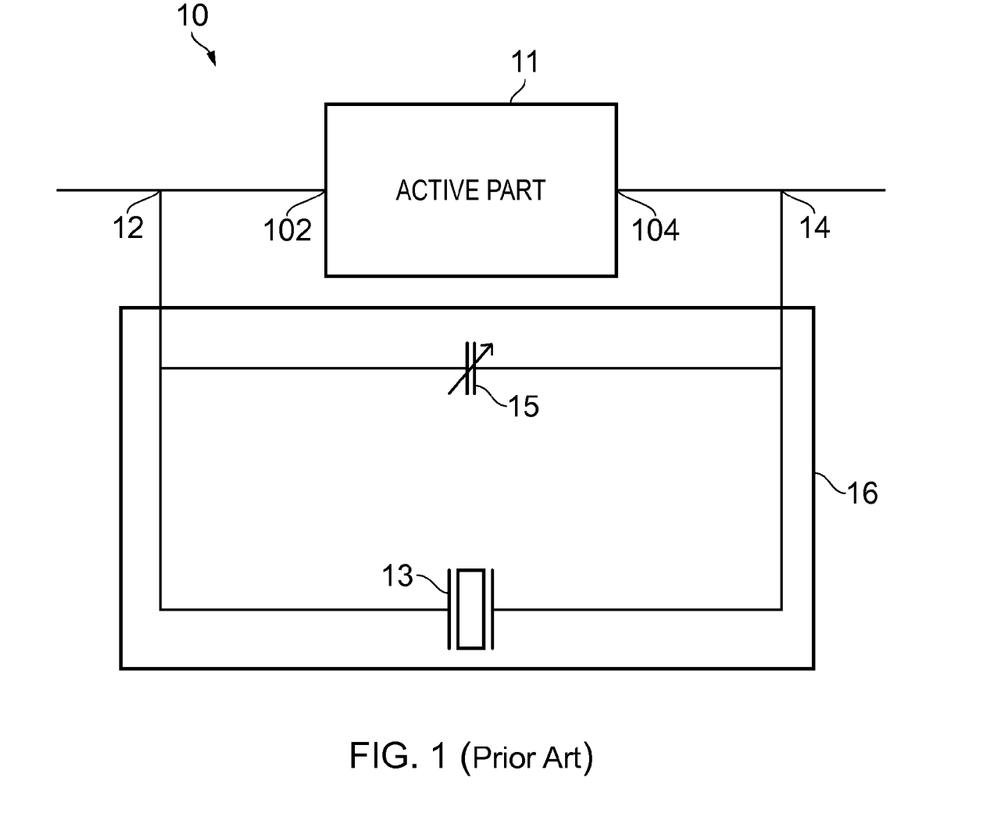
FIG. 1 is a block schematic diagram of a prior art crystal oscillator.

Crystal oscillators are commonly used in electronic systems, for example a mobile phone, to generate highly accurate clock signals. Referring to FIG. 1, a typical crystal oscillator 10 comprises an active part 11, which may be an amplifier, and a tank 16 coupled between an input 102 of the active part 11 and an output 104 of the active part 11. The input 102 of the active part 11 is coupled to a first terminal 12 of the crystal oscillator 10, and an output 104 of the active part 11 is coupled to a second terminal 14 of the crystal oscillator 10. The tank 16 comprises a crystal 13 coupled between the input and output 102, 104 of the active part 11, and a variable capacitor 15 also coupled between the input and output 102, 104 of the active part 11. The variable capacitor 15 may be omitted if tuning of the crystal oscillator 10 is not required, in which case the crystal 13 is the tank 16, as the crystal 13 has inherent capacitance and inductance. The tank 16 provides negative feedback from the output 104 of the active part 11 to the input 102 of the active part 11. Oscillation may be started by thermal noise in the crystal oscillator 10, and the noise is amplified by the active part 11. An oscillation signal is delivered at the second terminal 14 of the crystal oscillator 10. The amplitude of the oscillation signal is gradually built up to a final value, which may take several milliseconds. A resonant frequency of the tank 16 determines the frequency of oscillation.

To reduce power consumption, a crystal oscillator may be turned on only when needed. For example, in an idle mode of a mobile phone, the crystal oscillator may be turned on several times each second to listen to paging messages and then turned off again.

A drawback of crystal oscillators is the relatively long start-up time until the oscillation signal reaches its final amplitude, because crystals oscillators have a high Q-factor, where the Q-factor, also known as the quality factor, of the oscillator is defined as $$Q = 2\pi(\text{energy stored/energy dissipated per cycle of oscillation}).$$

Typically, a crystal oscillator has a Q-factor of the order $10^5$. The higher the Q-factor, the longer the start-up time, and the higher the power consumption in the idle mode as the crystal oscillator needs to be turned for a longer time before it can be used.

There is a requirement for an improved oscillator circuit.

SUMMARY OF THE PREFERRED EMBODIMENTS

According to a first aspect there is provided an oscillator circuit comprising:

a first oscillator comprising a crystal and arranged to generate a first oscillation signal at a first frequency, wherein the first oscillator has a first Q-factor;

a second oscillator arranged to generate a second oscillation signal at a second frequency, wherein the second oscillator has a second Q-factor lower than the first Q-factor;

a phase detector arranged to generate a difference signal indicative of a phase difference between the first and second oscillation signals;

a filter arranged to generate a frequency control signal by filtering the difference signal;

a frequency control storage device arranged to store a value of the frequency control signal;

a selector switch having selectable first and second selector states, wherein in the first selector state the selector switch is arranged to deliver to a frequency control input of the second oscillator the stored value of the frequency control signal, and in the second selector state the selector switch is arranged to deliver to the frequency control input of the second oscillator the frequency control signal generated by the filter whereby the second frequency is tuned towards the first frequency;

a gating switch having selectable first and second gating states, wherein in the first gating state the gating switch is arranged to couple an output of the second oscillator to a terminal of the crystal and in the second gating state the gating switch is arranged to de-couple the output of the second oscillator from the terminal of the crystal; and a controller arranged to select the states of the selector switch and the gating switch.

Therefore the second oscillator, as it has a lower Q-factor than the first oscillator, may start up more quickly than the first oscillator, and, by controlling the states of the selector switch and the gating switch, the second oscillator may kick-start the first oscillator, which may reduce a start-up time of the first oscillator. The oscillator may enable, in a low complexity manner, tuning the second frequency towards the first frequency, which may also reduce the start-up time of the first oscillator. In particular, the difference signal indicative of the phase difference between the first and second oscillation signals may enable the frequency calibration to be performed quickly, with low complexity, and with high accuracy. The reduced start-up time of the first oscillator may enable power consumption to be reduced, in particular where the first oscillator is required to be started and stopped frequently.

The controller may be arranged to switch-on the first and second oscillators and to select the states of the selector switch and the gating switch such that for a first time period commencing when both of the first and second oscillators have been switched on, the selector switch has the first selector state and the gating switch has the first gating state, and for a second time period commencing at completion of the first time period, the gating switch has the second gating state. This feature may enable the second oscillator to kick-start the first oscillator in an efficient manner, which may reduce a start-up time of the first oscillator, and may thereby enable power consumption to be reduced.

The controller may be arranged to switch-on the second oscillator no later than switching-on the first oscillator. This feature may enable the second oscillator to kick-start the first oscillator in an efficient manner, which may reduce a start-up time of the first oscillator, and may thereby enable power consumption to be reduced.

The oscillator circuit may be arranged to perform frequency calibration during the second time period by the selector switch being arranged to have the second selector state and the frequency control storage device being arranged to update the stored value of the frequency control signal by storing a current value of the frequency control signal. This feature may enable a frequency difference between the first frequency of the first oscillator and the second frequency of the second oscillator to be reduced, which may reduce a start-up time of the first oscillator, and may thereby enable power consumption to be reduced.

According to a second aspect there is provided a method of operating an oscillator circuit, the oscillator circuit comprising a first oscillator comprising a crystal and arranged to generate a first oscillator signal at a first frequency, wherein the first oscillator has a first Q-factor; and a second oscillator arranged to generate a second oscillator signal at a second frequency, wherein the second oscillator has a second Q-factor lower than the first Q-factor, the method comprising:

switching on the first and second oscillators;

for a first time period commencing when both of the first and second oscillators have been switched on, delivering a stored value of a frequency control signal to a frequency control input of the second oscillator and delivering the second oscillator signal generated by the second oscillator to a terminal of the crystal;

for a second time period, commencing with completion of the first time period, de-coupling the second oscillator signal from the terminal of the crystal; and during the second time period, performing a frequency calibration by generating a difference signal indicative of a phase difference between the first and second oscillator signals, generating a frequency control signal by filtering the difference signal, delivering the frequency control signal to the frequency control input of the second oscillator whereby the second frequency is tuned towards the first frequency, and updating the stored value of the frequency control signal by storing a current value of the frequency control signal.

Therefore the second oscillator, as it has a lower Q-factor than the first oscillator, may start up more quickly than the first oscillator, and the second oscillator may kick-start the first oscillator during the first time period, which may reduce a start-up time of the first oscillator. The frequency calibration during the second time period may reduce the difference between the first and second frequencies, and therefore may reduce the start-up time of the first oscillator. The difference signal indicative of the phase difference between the first and second oscillation signals may enable the frequency calibration to be performed quickly, with low complexity, and with high accuracy. The improvements may enable power consumption to be reduced, in particular where the first oscillator is required to be started and stopped frequently.

The first and second oscillators may be arranged to switch-off at completion of the storing of the current value of the frequency control signal. Likewise, the method may comprise switching off the first and second oscillators at completion of the storing of the current value of the frequency control signal. This feature may enable the start-up time of the first oscillator to be reduced by deferring performing the frequency calibration until just before switch-off, thereby enabling the most up-to-date value of the frequency control signal to be used when next switching on the first oscillator.

A duration of the first time period may be dependent on a difference between the first frequency and the second frequency. In particular, the duration of the first time period may be within the range $$\frac{1}{2|F_1 - F_2|} \pm 25\%,$$

where $F_1$ is the first frequency and $F_2$ is the second frequency. These features may enable the start-up time of the first oscillator to be reduced.

The oscillator circuit may comprise an amplitude detector arranged to generate an amplitude signal indicative of an amplitude of the first oscillation signal, and the controller may be arranged to modify a/the duration of the first time period dependent on a time taken for the amplitude signal to reach a target amplitude during the second time period. Likewise, the method may comprise generating an amplitude signal indicative of an amplitude of the first oscillation signal, and modifying a/the duration of the first time period dependent on a time taken for the amplitude signal to reach a target amplitude during the second time period. This feature may enable the start-up time of the first oscillator to be reduced.

The oscillator circuit may comprise a target count storage device arranged to store a value of a target number of cycles of the second oscillation signal corresponding to the duration of the first time period, and a counter arranged to determine the completion of the first time period by counting the cycles of the second oscillation signal up to the target number during the first time period. Likewise, the method may comprise storing a value of a target number of cycles of the second oscillation signal corresponding to the duration of the first time period, and determining the completion of the first time period by counting the cycles of the second oscillation signal up to the target number during the first time period. This feature may enable the completion of the first time period to be determined without requiring a high stability clock.

The counter may be arranged to determine the time taken for the amplitude signal to reach the target amplitude during the second time period by counting the cycles of the second oscillation signal during the second time period until the amplitude signal reaches the target amplitude, and the controller may be arranged to modify the duration of the first time period by modifying the stored value of the target number of cycles of the second oscillation signal dependent on the number of cycles of the second oscillation signal counted during the second time period time until the amplitude signal reaches the target amplitude. Likewise, the method may comprise determining the time taken for the amplitude signal to reach the target amplitude during the second time period by counting the cycles of the second oscillation signal during the second time period until the amplitude signal reaches the target amplitude, and modifying the duration of the first time period by modifying the stored value of the target number of cycles of the second oscillation signal dependent on the number of cycles of the second oscillation signal counted during the second time period time until the amplitude signal reaches the target amplitude. This feature may enable the start-up time of the first oscillator to be reduced.

According to a third aspect, there is provided a wireless communication device comprising an oscillator circuit according to the first aspect.

Preferred embodiments are described, by way of example only, with reference to the accompanying drawings.

DETAILED DESCRIPTION OF PREFERRED EMBODIMENTS

Figure 2:
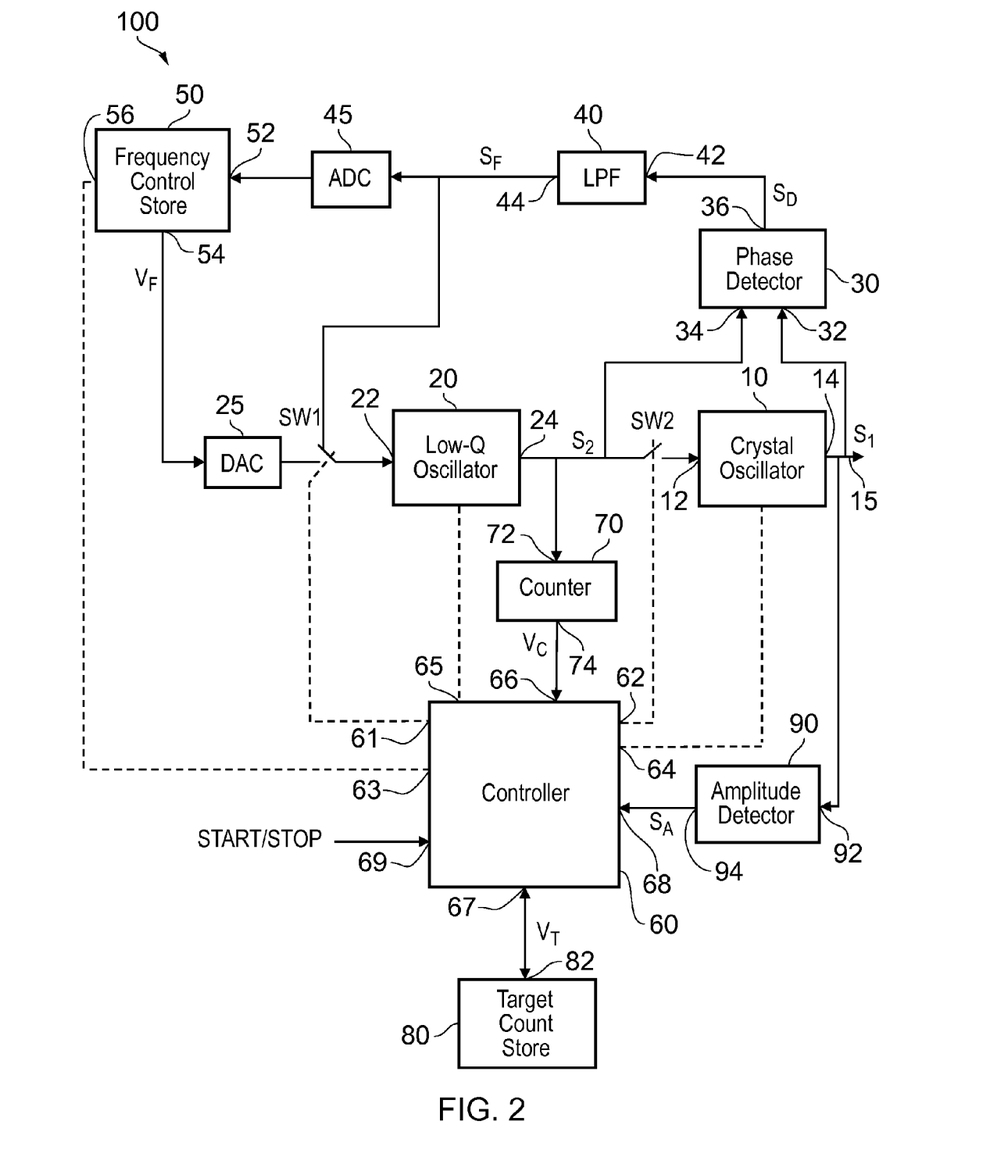
FIG. 2 is a block schematic diagram of an oscillator circuit.

Referring to FIG. 2, an oscillator circuit 100 comprises a first oscillator 10, which in this embodiment is the crystal oscillator described above with reference to FIG. 1, although alternatively other configurations of crystal oscillator may be used, and a second oscillator 20. The first oscillator 10 delivers a first oscillation signal $S_1$ having a first frequency $F_1$ at the second terminal 14 of the first oscillator 10, and the second terminal 14 of the first oscillator 10 is coupled to an output 15 of the oscillator circuit 100. The first oscillator 10 has a first Q-factor, and the second oscillator 20 has a second Q-factor that is lower than the first Q-factor. For example, the first Q-factor may be in the range $10^3$ to $10^6$ and the second Q-factor may be, depending on the architecture of the second oscillator 20, in the range 0.1 to 100. Typically, the first Q-factor may be at least ten times greater than the second Q-factor. In one embodiment, the first Q-factor may $10^5$ and the second Q-factor may be 100. Therefore, the second oscillator 20 may also be referred to as a low-Q oscillator. Because the second oscillator 20 has a lower Q-factor than the first oscillator 10 has, the second oscillator 20 can start up faster than the first oscillator can start up when switched on.

The second oscillator 20 is tunable in frequency by means of a frequency control signal $S_F$, or a value of a frequency control signal $V_F$, applied at a frequency control input 22 of the second oscillator 20. A second oscillation signal $S_2$ having a second frequency $F_2$ is delivered at an output 24 of the second oscillator 20. The output 24 of the second oscillator 20 is coupled to the first terminal 12 of the first oscillator 10 via a gating switch SW2 that is controlled by a controller 60. Therefore, the output 24 of the second oscillator 20, and consequently the second oscillation signal $S_2$, may be coupled to, and de-coupled from, the first terminal 12 of the first oscillator 10, which is also a first terminal 12 of the crystal 13, under control of the controller 60. In particular, the gating switch SW2 has a first gating state in which it couples the output 24 of the second oscillator 20 to the first terminal 12 of the first oscillator 10, and a second gating state in which it de-couples the output 24 of the second oscillator 20 from the first terminal 12 of the first oscillator 10.

The second terminal 14 of the first oscillator 10, which is also a second terminal of the crystal 13, is coupled to a first input 32 of a phase detector 30, and the output 24 of the second oscillator 20 is coupled to a second input 34 of the phase detector 30. The phase detector 30 generates a difference signal $S_D$ indicative of a phase difference between the first and second oscillation signals $S_1$, $S_2$, and therefore also indicative of a frequency difference between the first and second frequencies $F_1$, $F_2$, and delivers the difference signal $S_D$ at an output 36 of the phase detector 30. The output 36 of the phase detector 30 is coupled to an input 42 of a filter 40, which may be a low pass filter. The filter 40 filters the difference signal $S_D$ to remove relatively high frequencies from the difference signal, and delivers the frequency control signal $S_F$ at an output 44 of the filter 40. The output 44 of the filter 40 is coupled to an input 52 of a frequency control storage device 50. The frequency control storage device 50 is arranged to store, under the control of the controller 60 that is coupled to a control input 56 of the frequency control storage device 50, the value of the frequency control signal $V_F$ that is present at the input 52 of the frequency control storage device 50. The value of the frequency control signal $V_F$ stored in the frequency control storage device 50 can be read, also under the control of the controller 60, and is delivered at an output 54 of the frequency control storage device 50. The output 54 of the frequency control storage device 50, the output 44 of the filter 40, and the frequency control input 22 of the second oscillator 20 are coupled to a selector switch SW1. The selector switch SW1 has a first selector state and a second selector state, selectable under the control of the controller 60. In the first selector state, the selector switch SW1 couples the output 54 of the frequency control storage device 50 to the frequency control input 22 of the second oscillator 20 and de-couples the output 44 of the filter 40 from the frequency control input 22 of the second oscillator 20. In the second selector state, the selector switch SW1 de-couples the output 54 of the frequency control storage device 50 from the frequency control input 22 of the second oscillator 20 and instead couples the output 44 of the filter 40 to the frequency control input 22 of the second oscillator 20. Therefore, in the first selector state, the selector switch SW1 is arranged to deliver to the frequency control input 22 of the second oscillator 20 the stored value of the frequency control signal $V_F$, and in the second selector state the selector switch SW1 is arranged to deliver to the frequency control input 22 of the second oscillator 20 the frequency control signal $S_F$ generated by the filter 40. With the selector switch SW1 in the second selector state, the first and second oscillators 10, 20, the phase detector 30 and the filter 40 form a first phase locked loop, with the first oscillator 10 operating as a reference frequency for the second oscillator 20, whereby the second frequency $F_2$ is tuned towards the first frequency $F_1$ by tuning the second oscillator 20 in response to the frequency control signal $S_F$. The second frequency $F_2$ is preferably arranged to be, prior to operation of the first phase locked loop, close to the first frequency $F_1$, in order to reduce the time required to tune the second oscillator 20 towards the first frequency $F_1$.

For controlling the selector switch SW1, the gating switch SW2, and storing and reading the value of the frequency control signal $V_F$, a first output 61 of the controller 60 is coupled to the selector switch SW1, a second output 62 of the controller 60 is coupled to the gating switch SW2, and a third output 63 of the controller 60 is coupled to the control input 56 of the frequency control storage device 50. For starting and stopping generation of the first and second oscillation signals $S_1$, $S_2$ by, starting and stopping the first and second oscillators 10, 20, the first oscillator 10 is coupled to a fourth output 64 of the controller 60, and the second oscillator 20 is coupled to a fifth output 65 of the controller 60. In this way, the first and second oscillators 10, 20 can be started and stopped, or in other words, switched on and off. In FIG. 2, dashed lines signify control connections. The controller 60 also has a control input 69 for receiving an indication that first oscillator 10 should be started or stopped.

A counter 70 has an input 72 coupled to the output 24 of the second oscillator 20. The counter 70 counts pulses, or cycles, of the second oscillation signal $S_2$ and delivers a count value $V_C$ at an output 74 of the counter 70, which is coupled to a first input 66 of the controller 60. The controller 60 is arranged to start, stop and reset the counter 70. A target count storage device 80 has a port 82 coupled to a port 67 of the controller 60, via which the controller 60 is arranged to store and read a value of a target count $V_T$.

An amplitude detector 90 has an input 92 coupled to the second terminal 14 of the first oscillator 10 for receiving the first oscillation signal $S_1$, and generates at an output 94 of the amplitude detector 90 an amplitude signal $S_A$ indicative of an amplitude of the first oscillation signal $S_1$. The output 94 of the amplitude detector 90 is coupled to a second input 68 of the controller 60. In other embodiments, the amplitude detector 90 may be omitted.

An analogue-to-digital converter (ADC) 45 is shown in FIG. 2 coupled between the output 44 of the filter 40 and the input 52 of the frequency control storage device 50. Similarly, a digital-to-analogue converter (DAC) 25 is shown coupled between the output 54 of the frequency control storage device 50 and the selector switch SW1. The ADC 45 and DAC 25 are optional elements, depending on whether the frequency control signal $S_F$ and the stored value of the frequency control signal $V_F$ are in the analogue or digital domain, and on whether the frequency control input 22 of the second oscillator 10 requires an analogue or digital signal or value.

Operation of the oscillator circuit 100 is described below with reference to the flow chart of FIG. 3, assuming that the oscillator circuit 100 is initially switched off, that is, is not generating the first oscillation signal $S_1$ or the second oscillation signal $S_2$. This initial condition may result from inhibiting the flow of power to at least the first and second oscillators 10, 20, or by otherwise disabling operation of the first and second oscillators 10, 20. However, it is assumed that, even in the switched-off condition of the oscillator circuit 100, the controller is responsive to a first control signal START received at its control input 69 requesting switch-on of the oscillator circuit 100. Also, in the initial condition, the frequency control storage device 50 is arranged to store a value of the frequency control signal $V_F$ that is estimated to result in the second frequency $F_2$ of the second oscillation signal $S_2$ being the same as, or close to, the first frequency $F_1$ of the first oscillation signal $S_1$ when the oscillation circuit 100 is switched on and the stored value of the frequency control signal $V_F$ is applied to the frequency control input 22 of the second oscillator 20. For initial operation of the oscillator circuit 100, this stored value may be estimated by circuit simulation or empirically. Likewise, an initial value of the target count $V_T$ stored in the target count storage device 80 can be estimated as described below.

Figure 3:
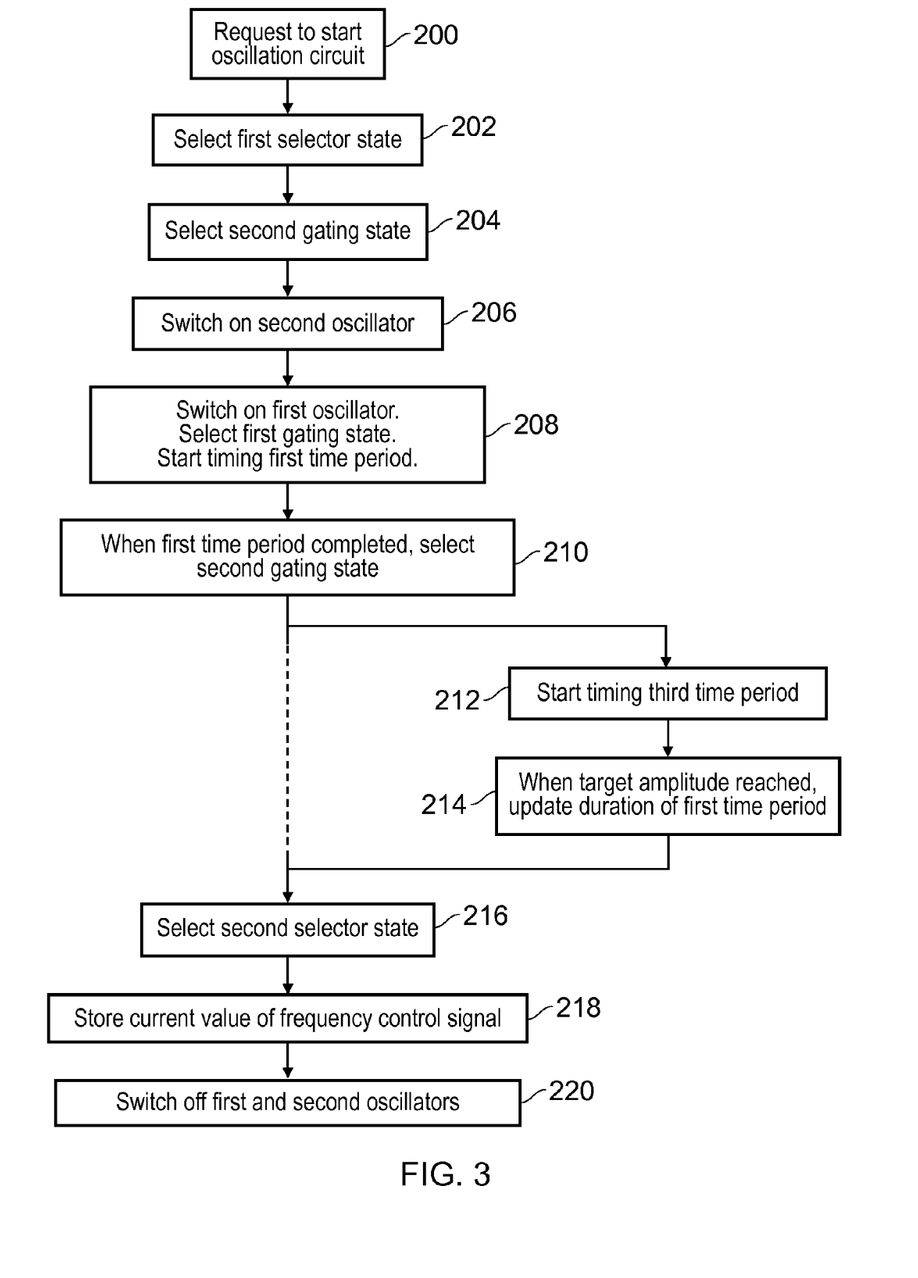
FIG. 3 is a flow chart illustrating operation of an oscillator circuit.

Referring to FIG. 3, steps 200, 202, 204, 206, 208 and 210 together form a start-up sequence of steps that may be executed while the oscillator circuit 100 is switched off, in order to switch on the oscillator circuit 100 such that it generates the first oscillation signal $S_1$ which it delivers at the output 15 of the oscillation circuit 100. During this start-up sequence, the second oscillation signal $S_2$ generated by the second oscillator 20 is used to kick-start the first oscillator 10 by pumping energy into the tank formed by the crystal 13 and the variable capacitor 15 of the first oscillator 10, at the second frequency $F_2$ which is arranged to be close to the first frequency $F_1$, to gradually build up the energy stored in the crystal. In particular, at step 200 the first control signal START is received at the control input 69 of the oscillator circuit 100. At step 202, in response to the first control signal START, the controller 100 selects the first selector state of the selector switch SW1, and at step 204 selects the second gating state of the gating switch SW2. At step 206 the second oscillator 20 is switched on by the controller 60, that is, it commences generation of the second oscillation signal $S_2$. Because the selector switch SW1 has the first selector state selected, the second frequency $F_2$ of the second oscillation signal $S_2$ is determined at step 206 by the stored value of the frequency control signal $V_F$.

At step 208, the first oscillator 10 is switched on by the controller 60, that is, it commences generation of the first oscillation signal $S_1$, although, due to the high Q-factor of the first oscillator 10, the amplitude of the first oscillation signal $S_1$ increases slowly, relative to the speed at which the amplitude of the second oscillation signal $S_2$ increases because the second oscillator 20 has a lower Q-factor. Although step 206 is shown in FIG. 3 as preceding step 208, it is not essential that the second oscillator 20 is switched on before the first oscillator 10 is switched on, and alternatively, the second oscillator 20 may be switched on at the same time as, or substantially the same time as, the first oscillator 10. Although the second oscillator 20 could kick-start the first oscillator 10 even if it is switched on after the first oscillator 10 is switched on, the kick-starting would be less efficient as the time taken for the first oscillation signal $S_1$ to reach final amplitude, from switch-on of the first oscillator 10, would be increased.

Also at step 208, the first gating state of the gating switch SW2 is selected by the controller 60, thereby coupling the output 24 of the second oscillator 20 to the first terminal 12 of the first oscillator 10, which is also the first terminal 12 of the crystal 13. Furthermore, at step 208, the controller 60 commences timing a first time period. The counter 60 does this by starting the counter 70, reading from the target count storage device 80 the value of the target count $V_T$, and comparing the count value $V_C$ of the counter 70 with the value of the target count $V_T$. The first time period is deemed completed when the count value $V_C$ is equal to the value of the target count $V_T$.

Step 210 is performed when the first time period is completed. At step 210, the second gating state of the gating switch SW2 is selected by the controller 60, thereby decoupling the output 24 of the second oscillator 20 from the first terminal 12 of the first oscillator 10. This completes the start-up sequence and the first oscillation signal $S_1$ may be employed as, for example, a clock signal, or a local oscillator signal for up-converting a signal to a radio frequency (RF) for transmission or for down-converting a received RF signal to baseband.

Steps 216 and 218 form a frequency calibration sequence of steps which may be performed after the first time period is completed, and in particular may be performed immediately prior to switching off the first and second oscillators 10, 20. Therefore, the frequency calibration may be performed in response to a second control signal STOP received at the control input 69 of the oscillator circuit 100. At step 216, the second selector state of the selector switch SW1 is selected by the controller 60, thereby delivering the frequency control signal $S_F$, instead of the stored value of the frequency control signal $V_F$, to the frequency control input 22 of the second oscillator 20. Therefore, the first and second oscillators 10, 20, the phase detector 30 and the filter 40 form the first phase locked loop, with the first oscillator 10 operating as a reference frequency for the second oscillator 20, whereby the second frequency $F_2$ is tuned towards the first frequency $F_1$ by tuning the second oscillator 20 with the frequency control signal $S_F$. At step 218, the current value of the frequency control signal $V_S$ is stored in the frequency control storage device 50, thereby updating the stored value of the frequency control signal $V_F$. This updated stored value is used to determine the first frequency $F_1$ of the first oscillation signal $S_1$ the next time the start-up sequence of steps 200, 202, 204, 206, 208 and 210 is executed. At step 220, the oscillator circuit 100 is switched off, by switching off the first and second oscillators 10, 20.

For convenience, the time following the completion of the first time period, until the switching-off of the oscillator circuit 100, is referred to herein as a second time period, although this second time period need not have a predetermined duration, and so it is not necessary to determine the duration of the second time period, for example by counting cycles of the second oscillation signal $S_2$ in the counter 70.

During the second time period, steps 212 and 214, which together form a time period calibration sequence of steps, may be performed. At step 212, the controller 60 commences measuring a third time period by starting, or re-starting, the counter 70. Typically, the start of the third time period coincides with the end of the first time period, where the second gating state of the gating switch SW2 is selected at step 210, and the beginning of the second time period, although this is not essential. During the third time period the controller 60 monitors the amplitude signal $S_A$, while the first oscillation signal $S_1$ increases in amplitude. At step 214, when the amplitude signal $S_A$ reaches a target amplitude value, the controller 60 terminates the third time period, by stopping the counter 70, and may update the stored value of the target count $V_T$ dependent on the count value attained by the counter 70 during the third time period in the target count storage device 80. An iterative approach to this updating may be used as described below, and the stored value of the target count $V_T$ need not be updated every time that the controller 60 performs the third time period measurement. The updated stored value of the target count $V_T$ is used for timing the first time period the next time the start-up sequence of steps 200, 202, 204, 206, 208 and 210 is executed. In this way, during the second time period, the controller 60 may modify the duration of the first time period dependent on the time taken for the amplitude signal to reach a target amplitude, that is, dependent on the duration of the third time period.

Figure 4:
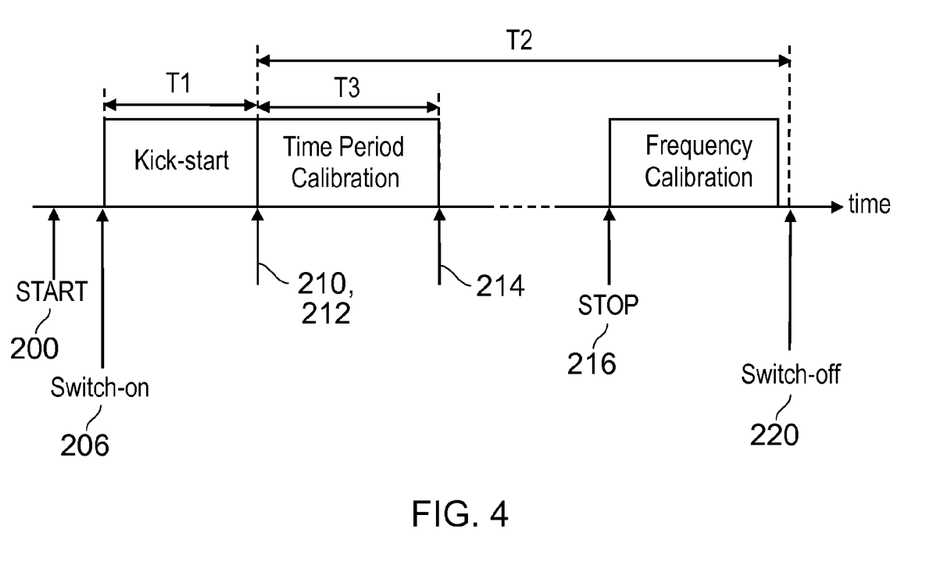
FIG. 4 is a timing diagram.

FIG. 4 is a timing diagram illustrating one possible sequence of events. In FIG. 4, the numerical values 200 to 220 correspond to steps of the flow chart of FIG. 3. Referring to FIG. 4, initially the first control signal START is received at step 200. The controller 60 then performs switch-on at step 206, which corresponds to the commencement of the first time period, denoted T1, and the kick-start of the first oscillator 10 by the second oscillator 20. Steps 210 and 212 correspond to the end of the first time period T1, and the start of the second and third time periods, denoted T2 and T3 respectively in FIG. 4. The time period calibration is executed during the third time periods T3. Step 214 corresponds to the end of the third time period T3. The third time period T3 is concurrent with the second time period T2. In response to receipt of the second control signal STOP at step 216, during the second time period T2, the frequency calibration sequence is commenced. After the frequency calibration sequence is completed, the controller 60 switches off the first and second oscillators 10, 20 at step 220, and this event also signifies the termination of the second time period T2.

Figure 5:
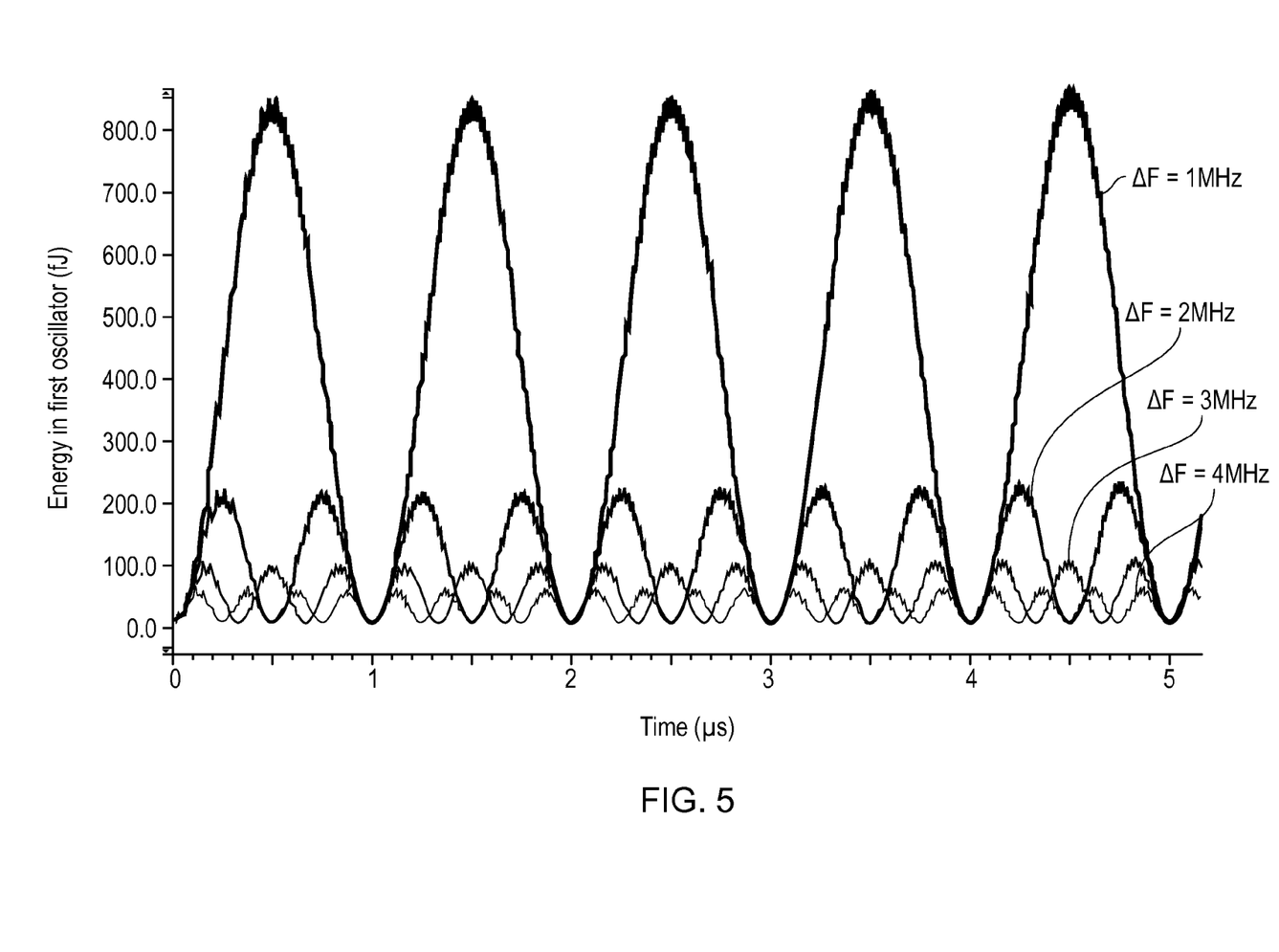
FIG. 5 is a graph illustrating variation with time of energy transferred to the first oscillator

While the second oscillator 20 is coupled to the first oscillator 10 during the start-up of the first oscillator, energy is transferred from the second oscillator 20 to the first oscillator 10, or more explicitly to the tank 16, and back again periodically, in an approximately sinusoidal manner, at a difference frequency $\Delta F$, that is the difference between the first frequency $F_1$ and the second frequency $F_2$, which can be expressed as a modulus function $\Delta F=|F_1-F_2|$. Indeed, most of the energy stored in the tank 16 is stored in the crystal 13. However, the amount of energy transferred to the first oscillator 10 is dependent on the difference frequency $\Delta F$, with more energy being transferred the smaller the difference frequency $\Delta F$ is. When the first and second oscillation signals $S_1$, $S_2$ are in phase, the second oscillation signal $S_2$ will charge the crystal 13 with energy, but when they are 180 degrees out of phase the second oscillation signal $S_2$ will start to discharge the energy stored in the crystal 13. This aspect is illustrated in FIG. 5, which is a graph of the energy transferred to the first oscillator 10 as a function of time when the first frequency $F_1$ is 26 MHz, and the second frequency $F_2$ is 25 MHz, 24 MHz, 23 MHz and 22 MHz, that is, the difference frequency $\Delta F$ is 1 MHz, 2 MHz, 3 MHz and 4 MHz. The energy transferred is relatively high when the difference frequency $\Delta F$ is 1 MHz and relatively low when the difference frequency $\Delta F$ is 4 MHz. In order to minimise the start-up time of the first oscillator 10, the transfer of energy to the first oscillator 10 should be maximised, and therefore it is preferable that the difference frequency is small. The difference frequency $\Delta F$ is dependent on, for example, process variations of the technology used to implement the first and second oscillators 10, 20, temperature, and ageing of the crystal 13. Also, if the stored value of the frequency control signal $V_F$ has a digital format, the difference frequency $\Delta F$ may be dependent on the resolution of this digital value and on quantisation error. These factors can result in the frequency difference $\Delta F$ being variable. An initial value of the stored value of the frequency control signal $V_F$ required to provide a small or zero difference frequency $\Delta F$ may be estimated, for example, during manufacture of the oscillator circuit 100, and this value will then be adjusted by updating during the frequency calibration.

In order to minimise the start-up time of the first oscillator 10, it is also desirable that the first time period T1 is terminated close to the peak of the approximately sinusoidal transfer of energy to the first oscillator 10, and in particular close to the first peak occurring after commencement of the first time period. Therefore, it is preferable that the duration of the first time period T1 is dependent on the difference frequency. In order to minimise the start-up time of the first oscillator 10, ideally the duration of the first time period is equal to a half of the period of the difference frequency $\Delta F$, that is $$T1 = \frac{1}{2\Delta F} \qquad (1)$$

However, a duration within a margin, either side of this ideal value can nevertheless result in useful reduction in start-up time of the first oscillator 10. For example, such a margin may be 25%, or 10%. An initial value of the first time period T1, and therefore an initial value of the target count $V_T$ may be determined using equation (1) and an estimate of the uncertainty of the first frequency $F_1$, and consequently an estimate of the value of the difference frequency $\Delta F$.

The oscillator circuit 100 employs a phased locked loop as described above to perform the frequency calibration to update the stored value of the frequency control signal $V_F$, in order to reduce the difference frequency $\Delta F$ when the start-up is next performed, thereby reducing the start-up time of the first oscillator 10. This approach enables low complexity control of the second frequency $F_2$, as it is not necessary to measure the first and second frequencies $F_1$, $F_2$ of, respectively, the first and second oscillators 10, 20; the updating is based on the frequency control signal $S_F$ that is generated, or in other words, derived, from the difference signal $S_D$ generated by the phase detector 30. The frequency calibration may be performed at any time during the second time period T2, although, for high reliability, preferably after the first oscillator 10 has reached maximum amplitude after start-up. A convenient time to perform the frequency calibration is just prior to switch-off, as this minimises the time delay between the frequency calibration and the next start-up, and therefore can contribute to reducing the frequency difference ΔF at the next start-up.

Figure 6:
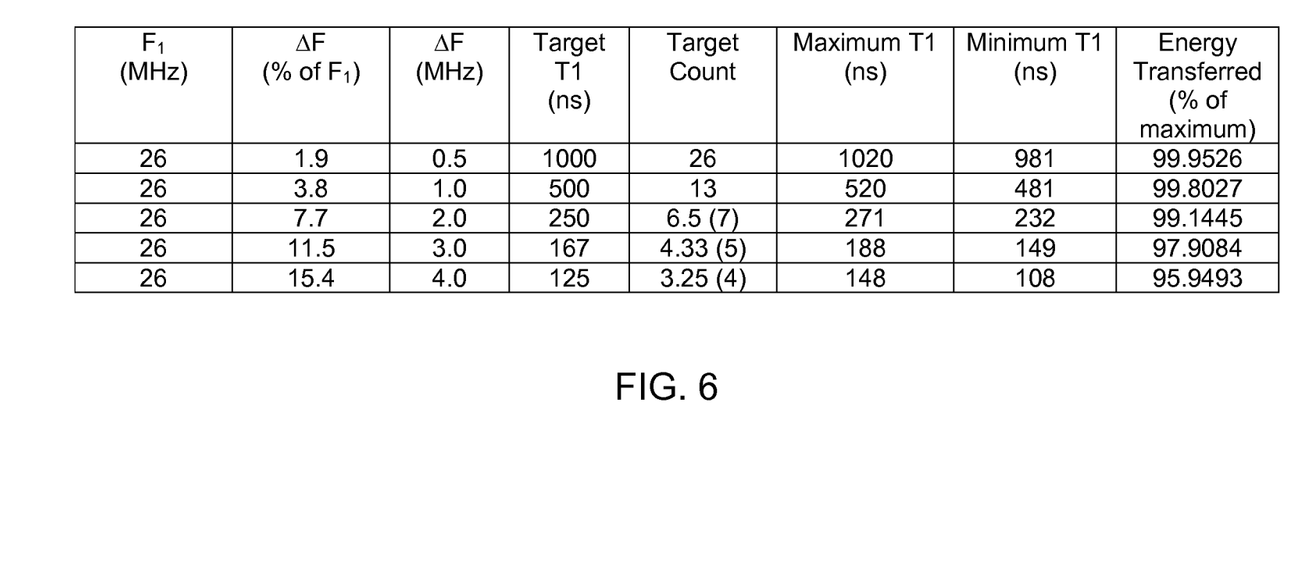
FIG. 6 is a table of example scenarios of operating conditions.

FIG. 6 is a table containing numerical examples for five scenarios where the first frequency $F_1$ is 26 MHz and the difference frequency ΔF, in the third column, is respectively 0.5, 1.0, 2.0, 3.0 and 4.0 MHz. The second column shows these values of the difference frequency ΔF expressed as a percentage of the first frequency $F_1$, namely 1.9, 3.8, 7.7, 11.5 and 15.4%. The fourth column contains the ideal value of the first time period T1 for the respective values of the difference frequency ΔF, calculated using equation (1). These values of the first time period T1 correspond to the time taken for the energy transfer depicted in FIG. 5 to reach the first peak of the respective graphs for the different values of the difference frequency ΔF. Although the shortest value of the first time period T1 in the fourth column of FIG. 6 occurs with the largest difference frequency ΔF, this does not imply that the start-up time of the first oscillator 20 is shortest, as the energy transferred is lowest, as demonstrated by FIG. 5. The shortest start-up time of the first oscillator 20 occurs when the energy transfer is highest, which occurs when the difference frequency ΔF is smallest. The fifth column contains the target count value $V_T$ for each scenario, and is number of cycles of the second oscillation signal $S_2$ to be counted by the counter 70 during the first time period T1. These values displayed in the fifth column of FIG. 6 have been calculated from the target values of the first time period T1 in the fourth column assuming that the second frequency $F_2$ is 26 MHz, equal to the first frequency $F_1$, rather than being offset from the first frequency $F_1$ by the frequency ΔF, as in practice, although the maximum expected value of the difference frequency ΔF may be predicted, it will generally be unknown whether the second frequency $F_2$ is higher or lower than the first frequency $F_1$. These target counts values $V_T$ are, therefore, an approximation to an optimum value, but the deviation from such an optimum is small. For example, when the difference frequency is 1 MHz and therefore the ideal value of the first time period T1 is 500 ns, then if the second frequency $F_2$ is 27 MHz the second oscillation signal $S_2$ would contain 13.5 cycles in 500 ns, and if the second frequency $F_2$ is 25 MHz the second oscillation signal $S_2$ would contain 12.5 cycles in 500 ns. Therefore, setting a target count value $V_T$ of 13, as shown in FIG. 6, is a close approximation to an optimum value. Moreover, where the number of cycles of 26 MHz occurring within the times listed in the fourth column of FIG. 6 is a non-integer, the target count value $V_T$ in the fifth column may selected as an integer, for example the nearest integer, or the next highest integer as shown in parentheses in FIG. 6. The initial value of the target count value $V_T$ may be selected according to an initial estimate or prediction of the maximum expected difference frequency ΔF, either from the table of FIG. 6 or by corresponding calculation for other values of the difference frequency ΔF.

The sixth column contains the maximum duration of the first time period T1 corresponding to counting the number of cycles shown in the fourth column, if the second frequency $F_2$ is lower than the first frequency $F_1$, and the seventh column contains the minimum duration of the first time period corresponding to counting the number of cycles shown in the fourth column, if the second frequency $F_2$ is higher than the first frequency $F_1$, in both cases using, the non-integer values of the fifth column in the case of the difference frequency ΔF being 2, 3 or 4 MHz. The deviation of these maximum and minimum times from the ideal value of the first time period T1 in the fourth column is highest where the difference frequency is greatest, and would in practice be larger in some cases if the non-integer values in the fifth column are round to integer values.

The eighth column of the table in FIG. 6 contains the energy transferred to the first oscillator 10 where the first time period T1 has the duration shown in the sixth or seventh columns, as a percentage of the maximum energy that would be transferred if the first time period T1 has the ideal duration shown in the fourth column. Although the three percentage values shown are all high, the maximum values of energy transferred to the first oscillator 10 are different in each of the scenarios, as described above in relation to FIG. 5, because each row of the table in FIG. 6 corresponds to a different one of the graphs in FIG. 5.

The oscillator circuit 100 described herein also performs the time period calibration to update the first time period T1 by updating the target count value $V_T$, although this is not essential and other embodiments may omit the amplitude detector 90 and the time period calculation, instead employing a constant target count value $V_T$ selected at manufacture. The time period calibration measures the time taken for the first oscillation signal $S_1$ to reach a target amplitude. The controller 60 may employ an iterative approach to adjusting the target count value $V_T$ in response to each successive execution of the time period calibration, because the controller 60 may initially have no indication of whether the second frequency $F_2$ is higher or lower than the first frequency $F_1$, and no indication of whether the first time period T1 should be increased or decreased to increase the transfer of energy to the first oscillator 10. Therefore, using an iterative approach, the controller 60 may, on different executions of the time period calibration, increase and decrease the value of the target count $V_T$ stored in the target count storage device 80 and monitor whether, at a subsequent start-up, the time taken for the first oscillation signal $S_1$ to reach the target amplitude has increased or decreased. In this way, the controller 60 may determine whether the first time period T1 should be increased or decreased to increase the transfer of energy to the first oscillator 10. For example, if increasing the duration of the first time period T1 results a decrease in the time taken for the first oscillation signal $S_1$ to reach the target amplitude, the controller 60 may further increase the first time period T1 the next time the time period calibration is performed. Likewise, if decreasing the duration of the first time period T1 results a decrease in the time taken for the first oscillation signal $S_1$ to reach the target amplitude, the controller 60 may further decrease the first time period T1 the next time the time period calibration is performed. Conversely, if increasing the duration of the first time period T1 results an increase in the time taken for the first oscillation signal $S_1$ to reach the target amplitude, the controller 60 may decrease the first time period T1 the next time the time period calibration is performed. Likewise, if decreasing the duration of the first time period T1 results an increase in the time taken for the first oscillation signal $S_1$ to reach the target amplitude, the controller 60 may increase the first time period T1 the next time the time period calibration is performed. The increase and decrease of the first time period T1 may be a constant increment, or a variable increment dependent on, for example, an amount by which the time taken for the first oscillation signal $S_1$ to reach the target amplitude varies.

Figure 7:
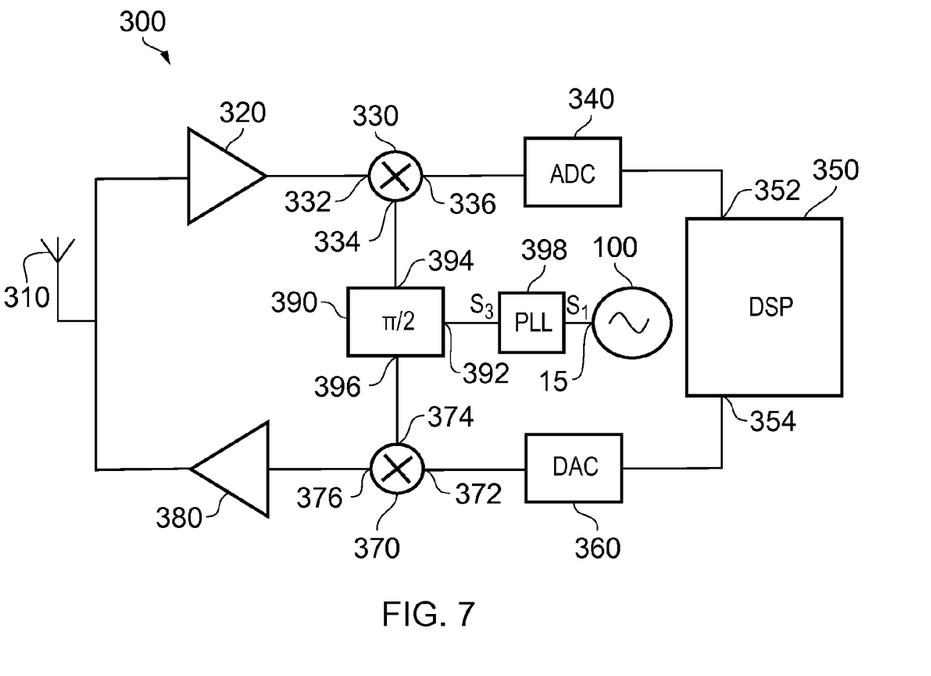
FIG. 7 is a block schematic diagram of a wireless communication device.

Referring to FIG. 7, a wireless communication device 300, for example a mobile phone, comprises an antenna 310 coupled to an input of a low noise amplifier 320 for amplifying an RF signal received by the antenna 310. An output of the low noise amplifier 320 is coupled to a first input 332 of a down-conversion stage 330 for down-converting the amplified RF signal to baseband by mixing the amplified RF signal with quadrature related components of a local oscillator signal present at a second input 334 of the down-conversion stage 330. An output 336 of the down-conversion stage 330 is coupled to an input 352 of a digital signal processor (DSP) 350 via an ADC 340 that digitises the baseband signal. The DSP 350 demodulates and decodes the digitised baseband signal. The DSP 350 also generates, at an output 354 of the DSP 350, a baseband signal for transmission. The output 354 of the DSP 350 is coupled to a first input 372 of an up-conversion stage 370 via a DAC 360. The up-conversion stage 370 up-converts the baseband signal to RF for transmission by mixing the baseband signal with quadrature related components of the local oscillator signal present at a second input 374 of the up-conversion stage 370. An output 376 of the up-conversion stage 370 is coupled to the antenna 310 via a power amplifier 380 that amplifies the RF signal for transmission. The wireless communication device 300 comprises the oscillator circuit 100. The output 15 of the oscillator circuit 100 is coupled to an input 392 of a phase shifting element 390 by means of a second phase locked loop 398. The second phase locked loop 398 employs the first oscillation signal $S_1$ received from the oscillator circuit 100 as a frequency reference, generates a third oscillation signal $S_3$ at a multiple of the first frequency $F_1$, and delivers the third oscillation signal $S_3$ to the input 392 of the phase shifting element 390. In embodiments where the first frequency is 26 MHz, the third oscillation signal S3 may have a frequency, for example, in the range 1 to 4 GHz. The phase shifting element 390 generates from the third oscillation signal $S_3$ quadrature related components of the local oscillator signal at a first output 394 and at a second output 396 of the phase shifting element 390. The first output 394 of the phase shifting element 390 is coupled to the second input 334 of the down-conversion stage 330, and the second output 396 of the phase shifting element 390 is coupled to the second input 374 of the up-conversion stage 370.

Although embodiments have been described in which the frequency calibration is executed after kick-starting the first oscillator 10 with the second oscillation signal $S_2$, this is not essential and alternatively, the frequency calibration may be executed after the first oscillator 10 has been started using only thermal noise in the first oscillator 10. Nevertheless, the oscillator circuit 100 is arranged, as described herein, to employ the value of the frequency control signal $V_F$ stored during the frequency calibration for a subsequent start-up of the first oscillator 10.

Other variations and modifications will be apparent to the skilled person. Such variations and modifications may involve equivalent and other features which are already known and which may be used instead of, or in addition to, features described herein. Features that are described in the context of separate embodiments may be provided in combination in a single embodiment. Conversely, features which are described in the context of a single embodiment may also be provided separately or in any suitable sub-combination.

It should be noted that the term "comprising" does not exclude other elements or steps, the term "a" or "an" does not exclude a plurality, a single feature may fulfil the functions of several features recited in the claims and reference signs in the claims shall not be construed as limiting the scope of the claims. It should also be noted that where a component is described as being "arranged to" or "adapted to" perform a particular function, it may be appropriate to consider the component as merely suitable "for" performing the function, depending on the context in which the component is being considered. Throughout the text, these terms are generally considered as interchangeable, unless the particular context dictates otherwise. It should also be noted that the Figures are not necessarily to scale; emphasis instead generally being placed upon illustrating the principles of the present invention.

The invention claimed is:

1. An oscillator circuit comprising:
a first oscillator comprising a crystal and arranged to generate a first oscillation signal at a first frequency, wherein the first oscillator has a first Q-factor;
a second oscillator arranged to generate a second oscillation signal at a second frequency, wherein the second oscillator has a second Q-factor lower than the first Q-factor;
a phase detector arranged to generate a difference signal indicative of a phase difference between the first and second oscillation signals;
a filter arranged to generate a frequency control signal by filtering the difference signal;
a frequency control storage device arranged to store a value of the frequency control signal;
a selector switch having selectable first and second selector states, wherein in the first selector state the selector switch is arranged to deliver to a frequency control input of the second oscillator the stored value of the frequency control signal, and in the second selector state the selector switch is arranged to deliver to the frequency control input of the second oscillator the frequency control signal generated by the filter whereby the second frequency is tuned towards the first frequency;
a gating switch having selectable first and second gating states, wherein in the first gating state the gating switch is arranged to couple an output of the second oscillator to a terminal of the crystal and in the second gating state the gating switch is arranged to de-couple the output of the second oscillator from the terminal of the crystal; and
a controller arranged to select the states of the selector switch and the gating switch, to switch-on the first and second oscillators and to select the states of the selector switch and the gating switch such that for a first time period commencing when both of the first and second oscillators have been switched on, the selector switch has the first selector state and the gating switch has the first gating state, and for a second time period commencing at completion of the first time period, the gating switch has the second gating state,
wherein a duration of the first time period is dependent on a difference between the first frequency and the second frequency and is within the range $$\frac{1}{2|F_1 - F_2|} \pm 25\%,$$

where $F_1$ is the first frequency and $F_2$ is the second frequency, wherein the controller is arranged to switch-on the second oscillator no later than switching-on the first oscillator.

2. An oscillator circuit as claimed in claim 1, wherein the oscillator circuit is arranged to perform frequency calibration during the second time period by the selector switch being arranged to have the second selector state and the frequency control storage device being arranged to update the stored value of the frequency control signal by storing a current value of the frequency control signal.

3. An oscillator circuit as claimed in claim 2, wherein the first and second oscillators are arranged to switch-off at completion of the storing of the current value of the frequency control signal.

4. An oscillator circuit as claimed in claim 1, comprising:
an amplitude detector arranged to generate an amplitude signal indicative of an amplitude of the first oscillation signal; and
wherein the controller is arranged to modify a/the duration of the first time period dependent on a time taken for the amplitude signal to reach a target amplitude during the second time period.

5. An oscillator circuit as claimed in claim 4, comprising:
a target count storage device arranged to store a value of a target number of cycles of the second oscillation signal corresponding to the duration of the first time period, and
a counter arranged to determine the completion of the first time period by counting the cycles of the second oscillation signal up to the target number during the first time period.

6. An oscillator circuit as claimed in claim 5, wherein:
the counter is arranged to determine the time taken for the amplitude signal to reach the target amplitude during the second time period by counting the cycles of the second oscillation signal during the second time period until the amplitude signal reaches the target amplitude;
wherein the controller is arranged to modify the duration of the first time period by modifying the stored value of the target number of cycles of the second oscillation signal dependent on the number of cycles of the second oscillation signal counted during the second time period time until the amplitude signal reaches the target amplitude.

7. A wireless communication device comprising:
an oscillator circuit, which comprises
a first oscillator comprising a crystal and arranged to generate a first oscillation signal at a first frequency, wherein the first oscillator has a first Q-factor;
a second oscillator arranged to generate a second oscillation signal at a second frequency, wherein the second oscillator has a second Q-factor lower than the first Q-factor;
a phase detector arranged to generate a difference signal indicative of a phase difference between the first and second oscillation signals;
a filter arranged to generate a frequency control signal by filtering the difference signal;
a frequency control storage device arranged to store a value of the frequency control signal;
a selector switch having selectable first and second selector states, wherein in the first selector state the selector switch is arranged to deliver to a frequency control input of the second oscillator the stored value of the frequency control signal, and in the second selector state the selector switch is arranged to deliver to the frequency control input of the second oscillator the frequency control signal generated by the filter whereby the second frequency is tuned towards the first frequency;
a gating switch having selectable first and second gating states, wherein in the first gating state the gating switch is arranged to couple an output of the second oscillator to a terminal of the crystal and in the second gating state the gating switch is arranged to de-couple the output of the second oscillator from the terminal of the crystal; and
a controller arranged to select the states of the selector switch and the gating switch, to switch-on the first and second oscillators and to select the states of the selector switch and the gating switch such that for a first time period commencing when both of the first and second oscillators have been switched on, the selector switch has the first selector state and the gating switch has the first gating state, and for a second time period commencing at completion of the first time period, the gating switch has the second gating state,
wherein a duration of the first time period is dependent on a difference between the first frequency and the second frequency and is within the range $$\frac{1}{2|F_1 - F_2|} \pm 25\%,$$

where $F_1$ is the first frequency and $F_2$ is the second frequency.

8. A method of operating an oscillator circuit, the oscillator circuit comprising a first oscillator comprising a crystal and arranged to generate a first oscillation signal at a first frequency, wherein the first oscillator has a first Q-factor; and a second oscillator arranged to generate a second oscillation signal at a second frequency, wherein the second oscillator has a second Q-factor lower than the first Q-factor, the method comprising:
switching on the first and second oscillators;
generating a difference signal indicative of a phase difference between the first and second oscillation signals;
generating a frequency control signal by filtering the difference signal;
for a first time period commencing when both of the first and second oscillators have been switched on, delivering a stored value of a frequency control signal to a frequency control input of the second oscillator and delivering the second oscillation signal generated by the second oscillator to a terminal of the crystal; and
for a second time period commencing with completion of the first time period, de-coupling the second oscillation signal from the terminal of the crystal and delivering the frequency control signal to the frequency control input of the second oscillator whereby the second frequency is tuned towards the first frequency,
wherein a duration of the first time period is dependent on a difference between the first frequency and the second frequency and is within the range $$\frac{1}{2|F_1 - F_2|} \pm 25\%,$$

where $F_1$ is the first frequency and $F_2$ is the second frequency, wherein the second oscillator is switched-on no later than the first oscillator is switched-on.

9. A method as claimed in claim 8, comprising performing frequency calibration during the second time period by delivering the frequency control signal to the frequency control input of the second oscillator and updating the stored value of the frequency control signal by storing a current value of the frequency control signal.

10. A method as claimed in claim 9, comprising switching-off the first and second oscillators at completion of the storing of the current value of the frequency control signal.

11. A method as claimed in claim 8, comprising:

generating an amplitude signal indicative of an amplitude of the first oscillation signal; and modifying a/the duration of the first time period dependent on a time taken for the amplitude signal to reach a target amplitude during the second time period.

12. A method as claimed in claim 11, comprising:

storing a value of a target number of cycles of the second oscillation signal corresponding to the duration of the first time period, and determining the completion of the first time period by counting the cycles of the second oscillation signal up to the target number during the first time period.

13. A method as claimed in claim 12, comprising:

determining the time taken for the amplitude signal to reach the target amplitude during the second time period by counting the cycles of the second oscillation signal during the second time period until the amplitude signal reaches the target amplitude, and modifying the duration of the first time period by modifying the stored value of the target number of cycles of the second oscillation signal dependent on the number of cycles of the second oscillation signal counted during the second time period time until the amplitude signal reaches the target amplitude.

* * * * *